United States Patent
Tanaka et al.

(10) Patent No.: US 7,358,475 B2
(45) Date of Patent: Apr. 15, 2008

(54) SOLID-STATE IMAGING DEVICE AND CAMERA

(75) Inventors: Syouji Tanaka, Ikoma (JP); Ryohei Miyagawa, Muko (JP); Toshiya Fujii, Otsu (JP); Yasuhiro Tanaka, Nishinomiya (JP); Michihiro Yamagata, Osaka (JP); Hiroaki Okayama, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 109 days.

(21) Appl. No.: 10/916,590

(22) Filed: Aug. 12, 2004

(65) Prior Publication Data
US 2005/0161584 A1    Jul. 28, 2005

(30) Foreign Application Priority Data
Jan. 26, 2004   (JP)   ............... 2004-017658

(51) Int. Cl.
*H01L 27/00* (2006.01)
*H04N 5/225* (2006.01)

(52) U.S. Cl. ................... 250/208.1; 348/344
(58) Field of Classification Search ............ 250/208.1; 359/619, 625, 626; 348/340, 344; 257/432, 257/434
See application file for complete search history.

(56) References Cited

U.S. PATENT DOCUMENTS

| | | | | |
|---|---|---|---|---|
| 5,371,397 A * | 12/1994 | Maegawa et al. | ............ | 257/432 |
| 5,420,634 A | 5/1995 | Matsumoto | | |
| 5,566,007 A * | 10/1996 | Ikeda et al. | ............... | 349/5 |
| 6,255,640 B1 * | 7/2001 | Endo et al. | .............. | 250/208.1 |
| 6,437,635 B1 * | 8/2002 | Watanabe | ................. | 327/514 |
| 6,518,640 B2 | 2/2003 | Suzuki et al. | | |
| 6,700,611 B1 * | 3/2004 | Masuyama | ................. | 348/300 |
| 2001/0036014 A1 | 11/2001 | Sasano et al. | | |
| 2002/0018299 A1 * | 2/2002 | Daniell | ...................... | 359/622 |
| 2002/0025164 A1 * | 2/2002 | Suzuki | ........................ | 396/429 |
| 2002/0079491 A1 * | 6/2002 | Raynor | ........................ | 257/59 |
| 2002/0135825 A1 * | 9/2002 | Lee et al. | ................... | 358/509 |
| 2002/0162943 A1 * | 11/2002 | Lee et al. | ................ | 250/208.1 |
| 2004/0004668 A1 * | 1/2004 | Namazue et al. | ........... | 348/340 |
| 2004/0196563 A1 * | 10/2004 | Natori | ....................... | 359/626 |

FOREIGN PATENT DOCUMENTS

| | | |
|---|---|---|
| EP | 0 441 594 | 8/1991 |
| EP | 0 744 778 | 11/1996 |
| JP | 8-316448 A | 11/1996 |
| TW | 485621 | 1/2002 |

* cited by examiner

*Primary Examiner*—Thanh X. Luu
*Assistant Examiner*—Kevin Wyatt
(74) *Attorney, Agent, or Firm*—McDermott Will & Emery LLP

(57) ABSTRACT

A solid-state imaging device includes pixels 2 arranged two-dimensionally on a semiconductor substrate 1. In a predetermined area in each pixel is formed a light-sensitive area 3 for receiving incident light 11, and each pixel includes a photoelectric conversion portion 4 for converting the incident light into a signal charge. In at least some of the pixels, the center of the light-sensitive area is offset from the center of the pixel when seen from directly above a principal surface of the semiconductor substrate. Each pixel further includes a light-path change member 12a and 12b for deflecting incident light traveling toward the center of the pixel so as to be directed toward the center of the light-sensitive area. Thus, a solid-state imaging device simultaneously realizing the miniaturization of pixels and a high image quality is provided.

13 Claims, 15 Drawing Sheets

F I G. 1
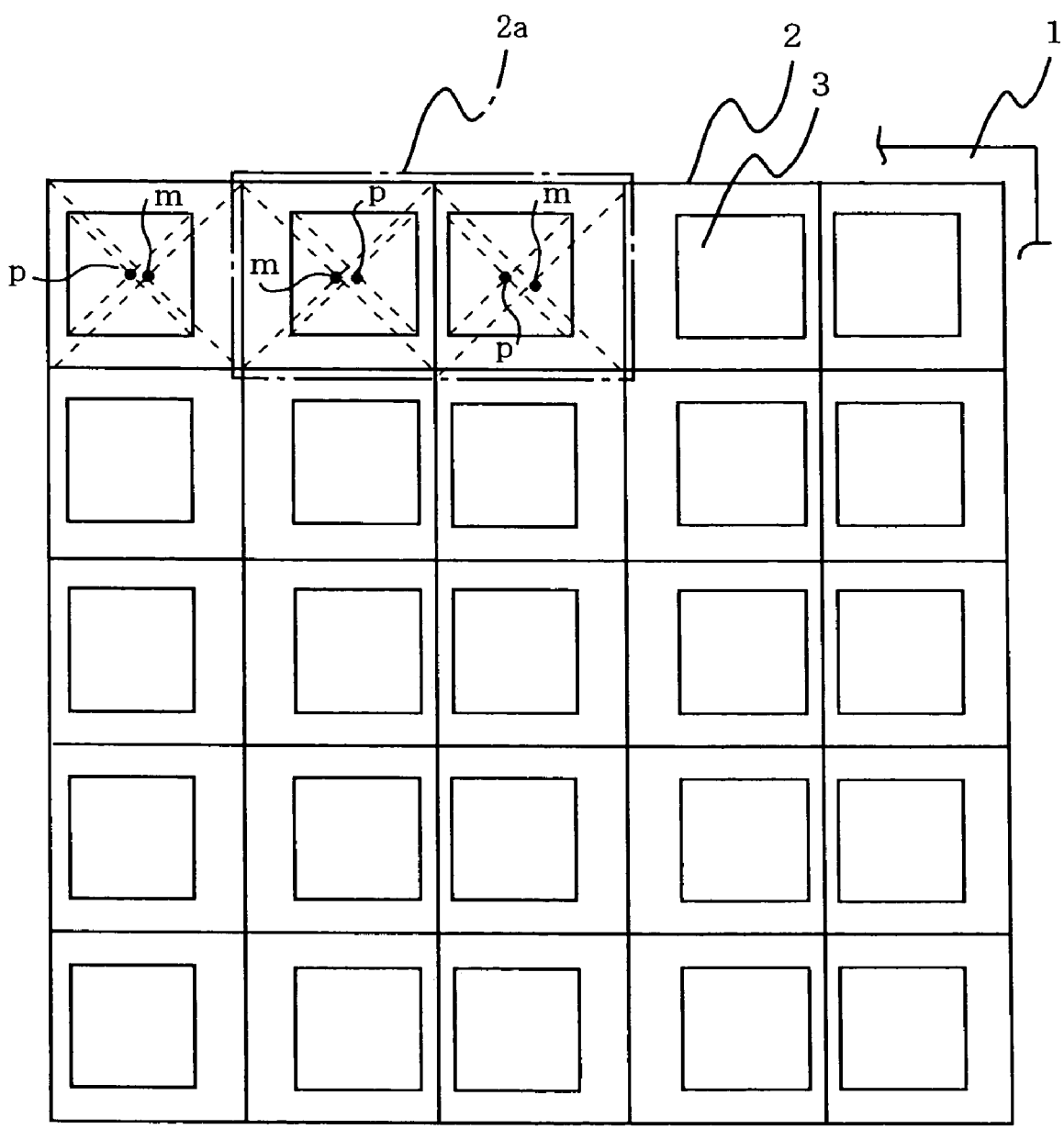

SOLID-STATE IMAGING DEVICE AND CAMERA

BACKGROUND OF THE INVENTION

1. Field of the Invention

The present invention relates to a solid-state imaging device. More particularly, the present invention relates to a solid-state imaging device in which a plurality of pixels are arranged in a matrix and to a camera utilizing the same.

2. Description of the Background Art

In a solid-state imaging device such as CCD and MOS image sensors, it is required to increase the light-condensing rate in order to improve image quality. To increase the light-condensing rate, a converging lens is used in general. With reference to the accompanying figures, a common structure of a solid-state imaging device will be described below.

FIG. 9 is a schematic top plan view for illustrating the positional relationship between pixels and light-sensitive areas in a solid-state imaging device in which a plurality of pixels are arranged in a matrix.

The solid-state imaging device illustrated in FIG. 9 includes a semiconductor substrate 1, pixels 2, and light-sensitive areas 3. As a semiconductor substrate 1, a p-type silicon substrate is generally used. On the semiconductor substrate 1, a plurality of pixels 2 are arranged in a matrix. Note that the pixels 2 shown herein are the pixels as projected onto a principal surface of the semiconductor substrate 1. Points m which are the centers of the pixels 2 as projected onto the semiconductor substrate 1 (hereinafter, each such point is referred to as "a center of the pixel) are arranged at regular intervals in both longitudinal and horizontal directions. Each pixel 2 includes a photoelectric conversion portion (not shown) which converts incident light into a signal charge. In a predetermined area of the pixel 2 is formed a light-sensitive area 3 for enabling the photoelectric conversion portion to receive incident light. A light-sensitive area 3 of the same shape is formed in each pixel 2, with the center of the light-sensitive area 3 coinciding with the center m of the pixel 2. Therefore, the centers p of light-sensitive areas 3 are also arranged at regular intervals in both longitudinal and horizontal directions.

Next, with reference to FIG. 10 and FIG. 11, the structures of the pixels 2 and the light-sensitive areas 3 are described more specifically. FIG. 10 is a top view of a solid-state imaging device. FIG. 11 shows a cross-sectional structure, taken along line A-B, of the solid-state imaging device shown in FIG. 10. The solid-state imaging device shown in FIG. 10 and FIG. 11 includes a semiconductor substrate 1, pixels 2, light-sensitive areas 3, photoelectric conversion portions 4, drain areas 5, gate electrodes 6, device separation areas 7, scanning circuit portions 8, a light-shielding film 22, a color filter 9, and converging lenses 10.

Each pixel 2 includes apart of a semiconductor substrate 1, a photoelectric conversion portion 4 (including a photodiode), a drain area 5, a gate electrode 6, a scanning circuit portion 8, and a device separation area 7. The photoelectric conversion portion 4, the drain area 5, and the device separation area 7 are formed on the semiconductor substrate 1. Between the photoelectric conversion portion 4 and the drain area 5 on the semiconductor substrate 1 is formed the gate electrode 6. On the surface of the semiconductor substrate 1, on which the gate electrode 6 is formed, an insulating film 21 is provided. On the insulating film 21 is formed the light-shielding film 22, which leaves a predetermined area within the photoelectric conversion portion 4 uncovered so as to define the light-sensitive area 3. On the light-shielding film 22 is formed the color filter 9, upon which a converging lens 10 is further disposed. The converging lens 10 is provided corresponding to each pixel 2. Thus, a solid-state imaging device in which one pixel is constructed as one cell (unit) is realized.

Each converging lens 10, which is provided corresponding to one pixel 2, is arranged so that an area occupied by its corresponding pixel 2 within a principal surface of the semiconductor substrate 1 can be utilized as efficiently as possible, in order to allow as much light to be converged on the pixel 2 as possible. That is, the converging lens 10 is arranged so that the center of the converging lens 10 coincides with the center m of the pixel 2 when seen from directly above the principal surface of the substrate. Similarly, the light-sensitive area 3, which is formed on each pixel 2, is arranged so that the center m of the pixel 2 and the center p of the light-sensitive area 3 coincide with each other when seen from directly above the principal surface of the substrate, in order to increase the light-condensing rate. If the solid-state imaging device is structured in this manner, incident light 11 on the pixel 2 is focused by the converging lens 10 and then travels toward the center m of the pixel 2. As a result, the incident light is converged on the center p of the light-sensitive area 3, so that a high light-condensing rate can be achieved.

In recent years, with the miniaturization of solid-state imaging devices, there is a desire to miniaturize pixels. To satisfy such a demand, as is described in Japanese Laid-Open Patent Publication No. 8-316448, for example, a proposal has been made in which neighboring pixels are allowed to share a gate electrode or a drain area so that miniaturization of the pixels can be achieved. The details thereof are described below, with respect to an exemplary solid-state imaging device in which every two pixels are constructed as one cell (unit).

FIG. 12 is a top view of a solid-state imaging device which is structured such that every two pixels constitute a unit 2a of pixels (a cell). The solid-state imaging device shown in FIG. 12 is identical to the solid-state imaging device shown in FIG. 10, except that every two neighboring pixels 2 share a drain area 5a. In this manner, miniaturization of pixels can be achieved by removing the device separation area 7, which is situated between the drain area 5 and the photoelectric conversion portion 4 in FIG. 10, and allowing the two pixels 2 to share the drain area 5a.

However, although miniaturization of pixels 2 is realized, the solid-state imaging device shown in FIG. 12 has a problem in that the light-condensing rate with respect to the entire solid-state imaging device becomes lower. As a result, aberration, color shading, sensitivity shading, the deterioration of image sensitivity, and the like occur.

A detailed description is made below, with reference to the accompanying figures.

FIG. 13 is a schematic top plan view for illustrating positional relationships between pixels 2 and light-sensitive areas 3 on the semiconductor substrate 1. Since two pixels 2 share a drain area 5a within a unit 2a of pixels as described above, the center m of the pixel 2 and the center p of the light-sensitive area 3 within each pixel 2 are offset from each other when seen from directly above a principal surface of the substrate. Therefore, although on the substrate the centers m of the pixels 2 are positioned at regular intervals, the centers p of the light-sensitive areas 3 are not positioned at regular intervals as are the centers m of the pixels 2, but are arranged such that the intervals are unevenly spaced.

FIG. 14 shows a cross-sectional structure, taken along line A-B, of the solid-state imaging device as shown in FIG. 12. As was described with reference to FIG. 13, the center m of a pixel 2 and the center p of its light-sensitive area 3 are offset from each other when seen from directly above a principal surface of the substrate. Although incident light 11 on the pixel 2 is focused by a converging lens 10 and then travels toward the center m of the pixel 2 as described above, the incident light 11 is not converged onto the center p of the light-sensitive area 3. As a result, the light-receiving sensitivity of the light-sensitive area 3 is reduced as compared with the case of the solid-state imaging device illustrated in FIG. 11. It would be conceivable to arrange each converging lens 10 so that its center is adjusted to the center p of the light-sensitive area 3 in order to increase the light-condensing rate. In this case, however, because as described above the centers p of the light-sensitive areas 3 on the substrate are not arranged at regular intervals, the configuration of converging lenses 10 would inevitably become complicated. Moreover, if the position of each converging lens 10 were to be adjusted to the center p of the light-sensitive area 3, the size of the converging lens 10 would have to become small. Hence, the entire area of the pixel 2 would not be covered by the smaller converging lens 10. Therefore, the entire area of the pixel 2 could not be utilized efficiently. As a result, the light-condensing rate would be reduced.

SUMMARY OF THE INVENTION

Therefore, an object of the present invention is to provide a solid-state imaging device in which not only miniaturization of pixels but also a high light-condensing rate, a high image sensitivity, and an excellent image quality are achieved, while reducing color shading and sensitivity shading.

The present invention has the following features to achieve the object above.

A solid-state imaging device according to the present invention comprises a semiconductor substrate and a plurality of pixels that are arranged in a two-dimensional arrangement on the semiconductor substrate, wherein, each of the plurality of pixels has a light-sensitive area formed in a predetermined area therein for receiving incident light, and includes a photoelectric conversion portion for converting the incident light received in the light-sensitive area into a signal charge; in at least some of the plurality of pixels, a center of the light-sensitive area is offset from a center of the pixel when seen from directly above a principal surface of the semiconductor substrate; and each of the plurality of pixels further includes a light-path change portion for deflecting incident light that travels toward the center of the pixel in such a manner that the incident light is directed toward the center of the light-sensitive area.

In addition, the plurality of pixels may be arranged in a matrix such that centers of the plurality of pixels are positioned at regular intervals, and centers of the plurality of light-sensitive areas are deviated from the regular intervals, so that a center of each of the plurality of light-sensitive areas is offset from a center of a corresponding pixel when seen from directly above the principal surface of the semiconductor substrate.

It is preferable that incident light is directed to a pixel area via at least one converging lens. Converging lenses may be those that are in a periodic arrangement such that one period corresponds to a plurality of pixels, or lenticular (cylindrical) lenses whose vertical cross section taken along a row direction of the matrix or whose vertical cross section taken along a column direction of the matrix is identical throughout the matrix.

A plurality of light-sensitive areas may be formed in one unit of pixels constituted by a plurality of pixels.

A light-path change portion according to the present invention is formed, for example, in a layer through which incident light passes before impinging on the light-sensitive area and which is formed of a material whose refractive index is higher than those of the materials of which the layer directly above and the layer directly below are formed. By having a tilt with respect to a light-receiving surface of the light-sensitive area, the light-path change portion can deflect incident light that travels toward the center of the pixel in such a manner that the incident light is directed toward the center of the light-sensitive area. Specifically, as such a light-path change portion, one that is in the shape of a lens or in the shape of a prism may be used. In the present invention, "a lens" refers to an object having a lens shape which has a convex surface or a concave surface on the incident side, whereas "a prism" refers to an object having a shape whose incident surface has, at least on a part thereof, a tilt with respect to the light-receiving surface. A plurality of lens-shaped or prism-shaped light-path change portions may be used. Moreover, any combination of lens-shaped light-path change portions and prism-shaped light-path change portions may be used. Still further, a light-path change portion having a shape which is obtained by joining a triangular prism and a convex lens together, with an inclined plane of the former and a level plane of the latter being adhered to each other, may be used.

Light-path change portions may be provided such that each corresponds to one pixel. Alternatively, the light-path change portions may be in a periodic arrangement such that each period corresponds to a plurality of pixels. Moreover, lenticular lenses, prismatic arrays, or some combination of the two whose vertical cross section taken along a row direction of the matrix of the pixels or whose vertical cross section taken along a column direction of the matrix of the pixels is identical throughout the matrix may be used.

A solid-state imaging device according to the present invention is, more specifically, a solid-state imaging device in which incident light is received in a light-sensitive area formed in each of a plurality of pixels arranged in a matrix on a semiconductor substrate, and an electrical signal of intensity according to intensity of the incident light is outputted, the solid-state imaging device comprising: a plurality of converging lenses for deflecting the incident light in such a manner that the incident light is converged on a center of each pixel, and a plurality of light-path change portions that are each provided corresponding to one pixel and which are each used for deflecting the incident light traveling toward a center of a corresponding pixel in such a manner that the incident light is directed toward a center of a corresponding light-sensitive area, wherein, the plurality of pixels each satisfy one of a predetermined number of positional relationships between the center of the pixel and the center of the light-sensitive area when seen from directly above a principal surface of the semiconductor substrate, such that the predetermined number of neighboring pixels satisfying all of the predetermined number of positional relationships constitute one unit of pixels; each unit of pixels thus has an identical structure containing the predetermined number of neighboring pixels; and one or more light-path change portions defining one unit are formed so as to correspond to one unit of pixels. In accordance with the above structure, the light-condensing rate can be further improved. The one or more light-path change portions defining one unit may be formed astride a plurality of neighboring units of pixels.

It is preferable that a solid-state imaging device according to the present invention be an amplifying solid-state imaging device.

A solid-state imaging device according to the present invention may suitably be used for a camera.

A solid-state imaging device according to the present invention has, in at least some of the pixels, light-path change portions for deflecting incident light that travels toward the centers of their corresponding pixels in such a manner that the incident light is directed toward the centers of the light-sensitive areas. Therefore, even if a solid-state imaging device is structured such that the centers of light-sensitive areas are offset from the centers of their corresponding pixels when seen from directly above a principal surface of the semiconductor substrate in order to achieve the miniaturization of pixels, a high light-condensing rate can be achieved. As a result, a solid-state imaging device in which miniaturization of pixels and a high image quality are achieved at the same time is provided.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram showing a relative arrangement of pixels and light-sensitive areas of a solid-state imaging device according to the present invention;

DESCRIPTION OF THE PREFERRED EMBODIMENTS

Figure 2:
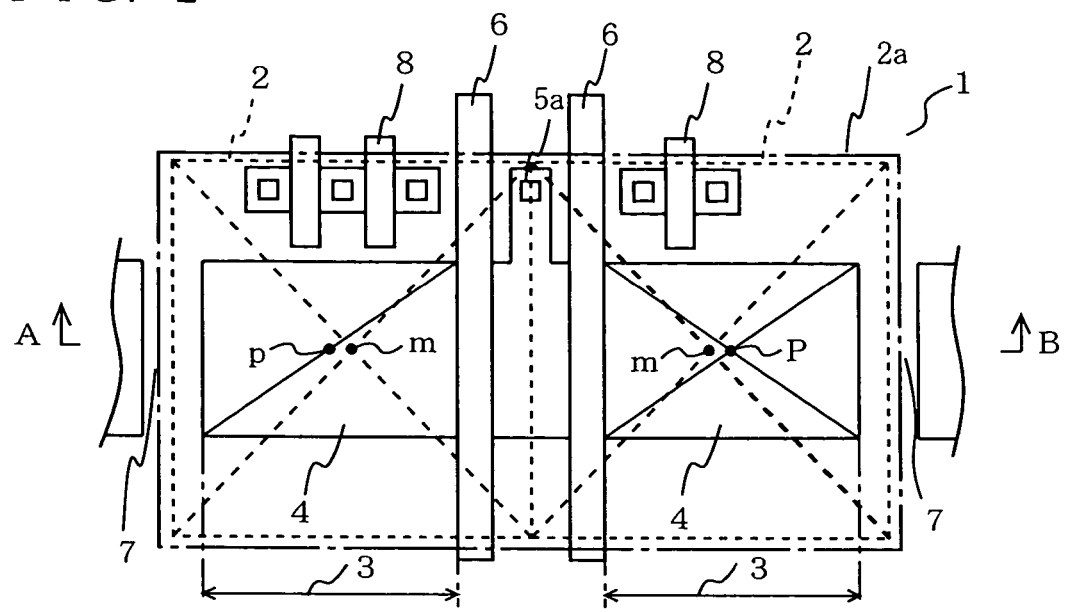
FIG. 2 is a diagram showing a planar structure of the solid-state imaging device according to the present invention.

A solid-state imaging device according to an embodiment of the present invention is described below with reference to the accompanying figures, illustrating an exemplary solid-state imaging device in which every two pixels define one cell.

FIG. 1 is a schematic top plan view for illustrating positional relationships between pixels and light-sensitive areas of a solid-state imaging device in which a plurality of pixels are arranged in a two-dimensional arrangement, e.g., a matrix.

The solid-state imaging device shown in FIG. 1 includes a semiconductor substrate 1, pixels 2, and light-sensitive areas 3. As the semiconductor substrate 1, a p-type silicon substrate is generally used. On the semiconductor substrate 1, a plurality of pixels 2 are arranged in a matrix and, in addition, units 2a of pixels, each unit 2a of pixels being constituted by two pixels defining one cell (unit), are constructed. Herein, the pixels 2 and the units 2a of pixels are shown as projections on a principal surface of the semiconductor substrate 1.

Each pixel 2 includes a photoelectric conversion portion (not shown), which converts incident light into a signal charge. In a predetermined area of the pixel 2 is formed a light-sensitive area 3 for enabling the photoelectric conversion portion to receive incident light. The plurality of pixels 2 are arranged so that all of the projected points m of the centers of the pixels 2 on the semiconductor substrate 1 (hereinafter referred to as "centers of pixels") are positioned at regular intervals.

Note that one unit 2a of pixels according to the present embodiment is constituted by a predetermined number (n) of neighboring pixels satisfying all of the predetermined number (n) of positional relationships with respect to the centers m of pixels and the centers of light-sensitive areas. Specifically, each of the predetermined number (n) of neighboring pixels constituting one unit satisfies a different one of the predetermined number (n) of positional relationships. Each unit 2a of pixels thus has an identical structure.

Figure 3A:
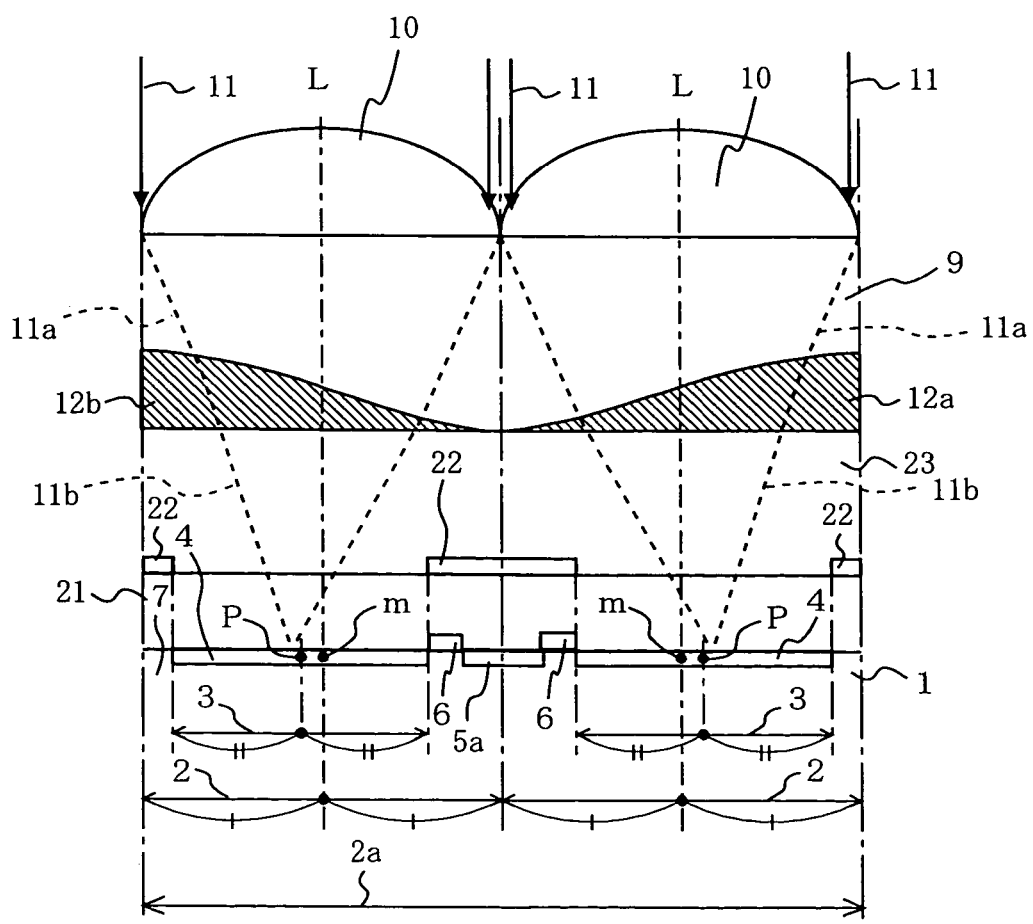
FIG. 3A is a diagram showing a cross-sectional structure of the solid-state imaging device according to the present invention.

Next, with reference to FIG. 2 and FIG. 3A, a structure of pixels 2 and light-sensitive areas 3 are described more specifically.

FIG. 2 is a top view of the solid-state imaging device. FIG. 3A shows a cross-sectional structure, taken along line A-B, of the solid-state imaging device shown in FIG. 2. The solid-state imaging device shown in FIG. 2 and FIG. 3A includes a semiconductor substrate 1, pixels 2, a unit 2*a* of pixels, light-sensitive areas 3, photoelectric conversion portions 4, a drain area 5*a*, gate electrodes 6, a light-shielding film 22, device separation areas 7, scanning circuit portions 8, an insulating film 21, a color filter 9, converging lenses 10, an interlayer insulating film 23, and prisms 12*a* and 12*b* that function as light-path change portions.

Each pixel 2 includes apart of a semiconductor substrate 1, a photoelectric conversion portion 4 (including a photodiode), a part of a drain area 5*a*, a gate electrode 6, a scanning circuit portion 8, and a device separation area 7. The photoelectric conversion portion 4, the drain area 5*a*, and the device separation area 7 are formed on the semiconductor substrate 1. Between the photoelectric conversion portion 4 and the drain area 5*a* on the semiconductor substrate 1, the gate electrode 6 is formed. On the semiconductor substrate 1, on which the gate electrode 6 is formed, an insulating film 21 is provided. On the insulating film 21 is formed a light-shielding film 22, which leaves a predetermined area within the photoelectric conversion portion 4 uncovered, so as to define a light-sensitive area 3. On the surface of the semiconductor substrate 1, on which the light-shielding film 22 is formed, an interlayer insulating film 23 is provided. On the interlayer insulating film 23, a prism 12*a* or 12*b* is formed. On the prism 12*a* or 12*b*, a color filter 9 is formed. On the color filter 9, a converging lens 10 is disposed. Here, each pair of two pixels 2 shares a drain area 5*a* and constitutes a unit 2*a* of pixels in which the two pixels are regarded as one cell (unit).

In the case of the structure in which two pixels are constructed as one cell, because two pixels 2 share a drain area 5*a* as described above, within each pixel 2, the center m of the pixel 2 and the center p of the light-sensitive area 3 are offset from each other when seen from directly above a principal surface of the substrate. Therefore, as will be more clearly understood by referring to FIG. 1, although on the substrate the centers m of the pixels 2 are positioned at regular intervals, the centers p of the light-sensitive areas 3 are not positioned at regular intervals as are the centers m of the pixels 2, but are arranged such that the intervals are unevenly spaced.

A converging lens 10, which is included in each pixel, is arranged so that an area occupied by its corresponding pixel 2 within a principal surface of the semiconductor substrate 1 can be utilized as efficiently as possible, in order to allow as much light to be converged on the pixel 2 as possible. That is, the converging lens 10 is arranged so that the center of the converging lens 10 coincides with the center m of the pixel 2 when seen from directly above the principal surface of the substrate. Here, converging lenses 10 are arranged in an array so that each of the converging lenses 10 corresponds to one light-sensitive area 3, and the converging lenses 10 are disposed such that the edges of neighboring converging lenses 10 are in contact with one another.

Figure 14:
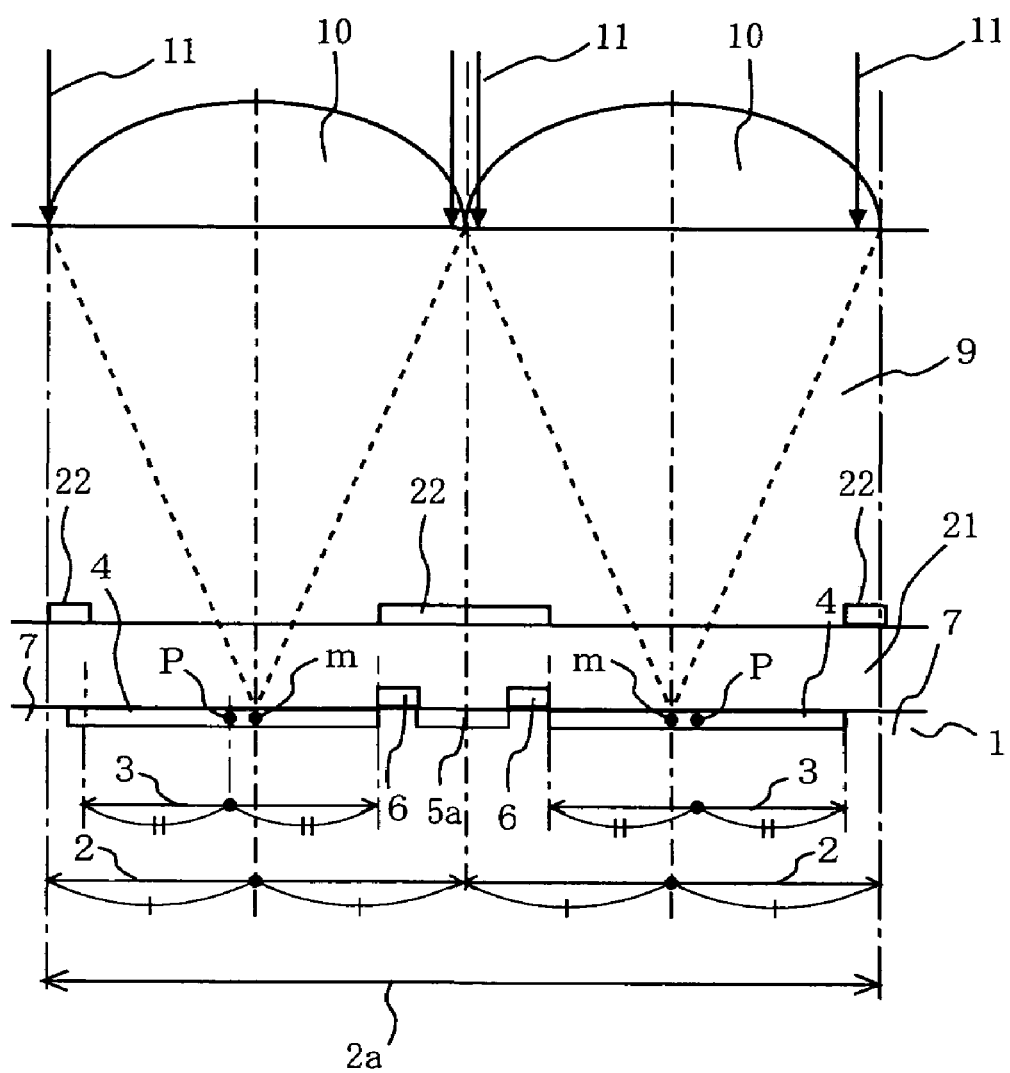
FIG. 14 is a diagram showing a cross-sectional structure of the conventional solid-state imaging device in which two pixels define one cell.

Incident light 11 which is to be incident on a pixel 2 is focused by the converging lens 10 and then travels toward the center m of the pixel 2. As described above, the center m of the pixel 2 and the center p of the light-sensitive area 3 are offset from each other when seen from directly above a principal surface of the substrate. Therefore, unless the pixel 2 includes a light-path change portion, the incident light will be received at a position apart from the center p of the light-sensitive area 3 as is shown in FIG. 14. In this case, a sufficient light-condensing rate cannot be achieved.

Therefore, in the present embodiment, in order to increase the light-condensing rate, each pixel 2 is provided with a light-path change portion. The light-path change portion, which is a characteristic component of the present embodiment, is described in detail below.

Figure 3B:
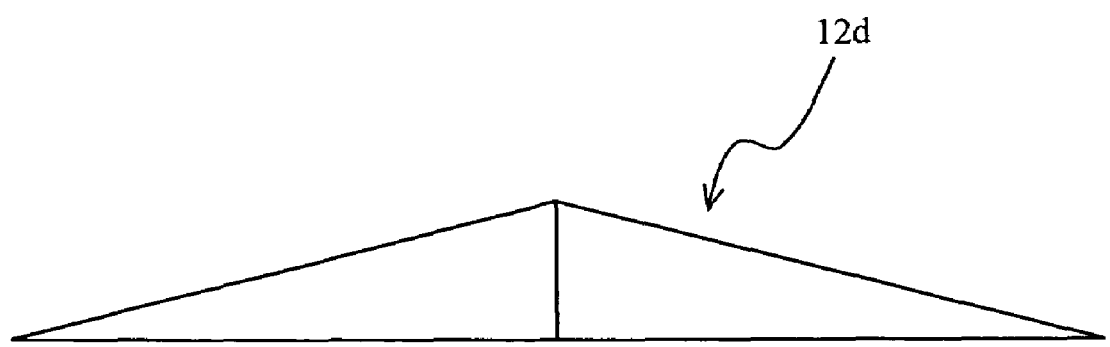
FIG. 3B is a diagram showing an example of a structure of a light-path change portion of the solid-state imaging device according to the present invention.
Figure 3C:
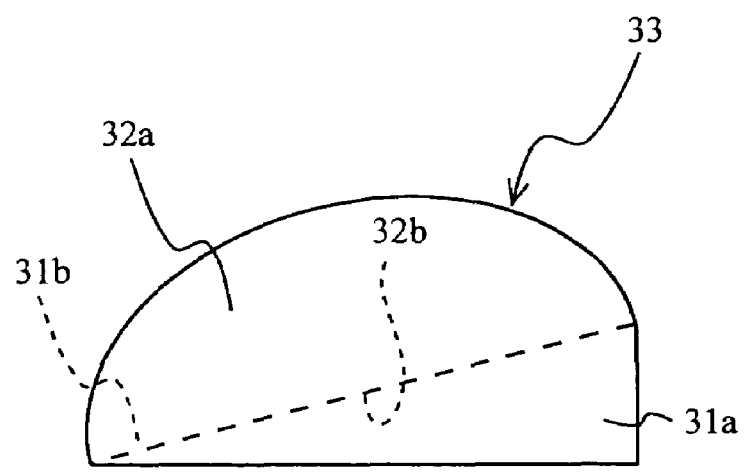
FIG. 3C is a diagram showing another example of a structure of the light-path change portion of the solid-state imaging device according to the present invention.

A light-path change portion is provided to deflect incident light 11 that travels toward the direction of the center m of the pixel 2 in such a manner that the incident light 11 is directed toward the center p of the light-sensitive area 3. The light-path change portion is formed, for example, in a layer through which incident light passes before impinging on the light-sensitive area and which is formed of a material whose refractive index is higher than those of the materials of which the layer directly above and the layer directly below are formed. By having a tilt with respect to a light-receiving surface of the light-sensitive area, the light-path change portion can deflect incident light that travels toward the center of the pixel in such a manner that the incident light is directed toward the center of the light-sensitive area. The light-path change portion may be in the form of a lens that has a convex surface or a concave surface on the incident side, or in the form of a prism whose incident surface has, at least on part thereof, a tilt with respect to the light-receiving surface. Other than the aforementioned prism 12*a* or 12*b*, a quadrangular-pyramid-shaped prism 12*d* whose vertical section makes a triangle, as shown in FIG. 3B, and the like may be employed as a prism-shaped light-path change portion. Moreover, a lens 33 having a shape which is obtained by joining a triangular prism 31*a* and a convex lens 32*a* together, with an inclined plane 31*b* of the former and a level plane 32*b* of the latter being adhered to each other, as shown in FIG. 3C, and the like may be used. In the present invention, it is sufficient to use at least only one type of lens-shaped or prism-shaped light-path change portions chosen from the aforementioned types, and it is also possible to use combinations of light-path change portions chosen from the aforementioned types. A plurality of types of lens-shaped and/or prism-shaped light-path change portions may be used concurrently. The curvature or gradient angle of a lens-shaped or prism-shaped light-path change portion is arbitrarily set depending on how much the incident light 11 should be deflected when the incident light 11, which travels toward the center m of the pixel 2, is bent toward the direction of the center p of the light-sensitive area 3. Light-path change portions may be provided such that each corresponds to a pixel. Alternatively, light-path change portions which are periodically arranged so that each corresponds to (i.e., extends over) a plurality of pixels defining one unit may be provided.

The present embodiment illustrates an exemplary case where prisms 12*a* and 12*b* which are periodically arranged so that each corresponds to two pixels defining one unit are used as light-path change portions, as shown in FIG. 3A. Because the prisms 12*a* and 12*b* have convex shapes that have curvatures on the incident surfaces, they could also be referred to as convex lenses having a prism function; however, the prisms 12*a* and 12*b* will continue to be referred to as "prisms," in order to distinguish them from lenses (described later) that have convex shapes on incident surfaces, i.e., convex lenses. The prisms 12*a* and 12*b*, each of which is provided corresponding to two pixels as one unit, are each placed between the semiconductor substrate 1 and the converging lens 10 so as to extend over two pixels 2. In each unit 2a of pixels, a subportion (corresponding to one pixel) of each of the prisms 12a and 12b extends over the unit 2a of pixels, and the inclined plane of each of the prisms 12a and 12b decreases toward the center of the unit 2a of pixels. When the unit 2a of pixels is seen from directly above the upper surface of the substrate, the prisms 12a and 12b appear elliptical. The center of each prism 12a or 12b is offset from the center of the unit 2a of pixels when seen from directly above a principal surface of the semiconductor substrate 1.

The prisms 12a and 12b are formed of a material (e.g., SiN (Silicon Nitride)) whose refractive index is higher than the refractive indices of the materials of the color filter 9 and the interlayer insulating film 23 respectively positioned directly above and below the prisms 12a and 12b. The prisms 12a and 12b can be obtained easily by a fabrication process which is described further below.

In the solid-state imaging device in which the prisms 12a and 12b (light-path change portions) are provided so as to correspond to a unit 2a of pixels in a manner shown in FIG. 3A, incident light 11 that travels in the direction of a pixel 2 is first focused by a converging lens 10 at such an angle that the incident light 11 is converged on the center m of the pixel 2 (the incident light at this stage is indicated by the numerical reference 11a). Then, the focused incident light 11a is refracted by the prism 12a or 12b so as to be directed to the center p of a light-sensitive area 3 (the incident light at this stage is indicated by the numerical reference 11b). Then, the refracted incident light 11b is received at the center p of the light-sensitive area 3 and is converted into a signal charge by a photoelectric conversion portion, which is formed in the light-sensitive area 3.

As described above, even in a solid-state imaging device in which the centers m of pixels 2 and the centers p of their corresponding light-sensitive areas 3 are offset from each other when seen from directly above a principal surface of a substrate, equipping the pixels 2 with light-path change portions makes it possible for incident light 11 that travels in the direction of the center m of a pixel 2 to be received at the center p of the corresponding light-sensitive area 3 without having to alter the arrangement of the corresponding converging lens 10, and thus a high light-condensing rate is achieved. As a result, there is realized a solid-state imaging device in which miniaturization of pixels 2 is achieved and which realizes an excellent image quality, while reducing color shading, sensitivity shading, the deterioration of image sensitivity and light-receiving sensitivity, and the like. For example, in the case of a three megapixel solid-state imaging device, in which one side of a pixel is 2.2 im long, the light-condensing rate for light that enters at an angle of 25° to the optic axis L indicated by a virtual line in FIG. 3A is improved by about 15%.

Next, a fabrication process of a solid-state imaging device having the above structure is described below, with reference to the accompanying figures. FIGS. 4A to 4E, FIGS. 5A to 5C, and FIGS. 6A and 6B show cross-sectional structures of the solid-state imaging device in various stages in the course of fabricating the solid-state imaging device according to the present embodiment.

Figure 4A:
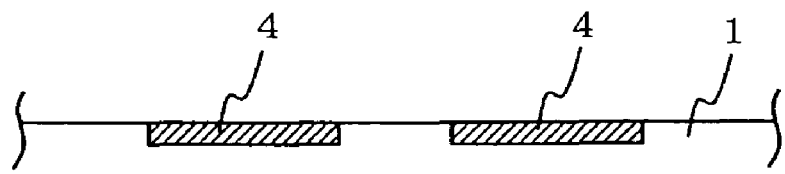
FIGS. 4A to 4E are diagrams showing cross-sectional structures of the solid-state imaging device according to the present invention during fabrication thereof.

First, photoelectric conversion portions 4 including photodiodes are formed in a matrix so as to be placed at regular intervals on a semiconductor substrate 1. A resulting cross-sectional structure of the solid-state imaging device is shown in FIG. 4A.

Figure 4B:
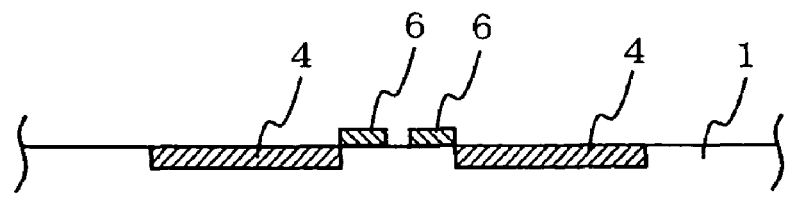

Next, on the surface of the semiconductor substrate 1, a gate insulating film (composed of silicon oxide), which is not shown in the figure, is formed by thermal oxidation of the silicon substrate. Then, on the gate insulating film, gate electrodes 6 are formed. Specifically, the gate electrodes 6 are formed by depositing a polysilicon film on the surface of the semiconductor substrate 1 by a CVD process and thereafter selectively removing the polysilicon film in predetermined areas by dry etching. A resulting cross-sectional structure of the solid-state imaging device is shown in FIG. 4B.

Figure 4C:
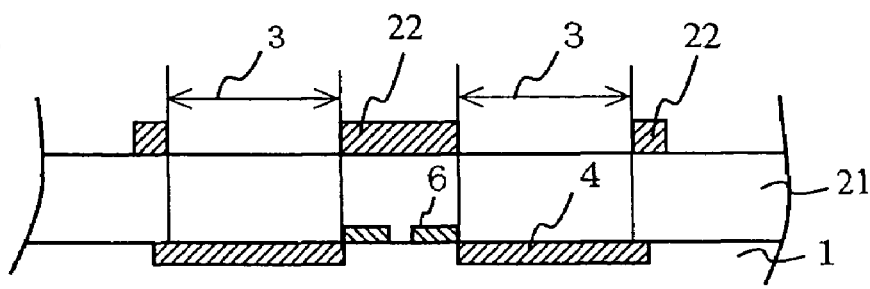

Next, an insulating film 21 (composed of silicon oxide) is formed by being deposited by a CVD process so as to cover the gate electrodes 6. Note that the insulating film 21 includes a wiring layer, the description of which is omitted here. Next, a light-shielding film 22 is formed so as to cover the insulating film 21. Specifically, a thin film of tungsten, copper, aluminum, or the like is formed by a PVD process or a CVD process so as to cover the insulating film 21, and thereafter the thin film is selectively removed by dry etching. Thus, in addition to the light-shielding film 22, light-sensitive areas 3 are formed. A resulting cross-sectional structure of the solid-state imaging device is shown in FIG. 4C.

Figure 4D:
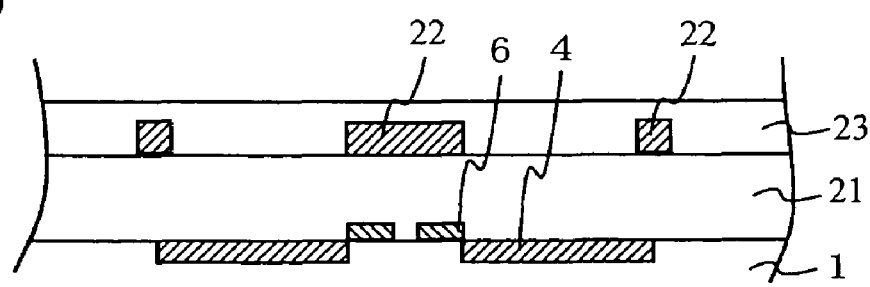

Next, a silicon oxide film is deposited by a CVD process on the light-shielding film 22 and the light-sensitive areas 3. By planarizing the surface of the silicon oxide film by a CMP process thereafter, an interlayer insulating film 23 is formed. A resulting cross-sectional structure of the solid-state imaging device is shown in FIG. 4D.

Figure 4E:
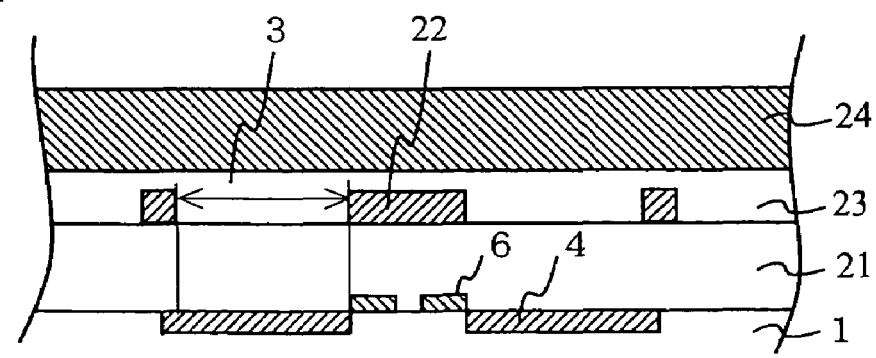

Next, an SiN film 24 whose refractive index is higher than that of the interlayer insulating film 23 is formed so as to cover the interlayer insulating film 23. Specifically, the SiN film 24 is formed by a PVD process or a CVD process so as to cover the interlayer insulating film 23. A resulting cross-sectional structure of the solid-state imaging device is shown in FIG. 4E.

Figure 5A:
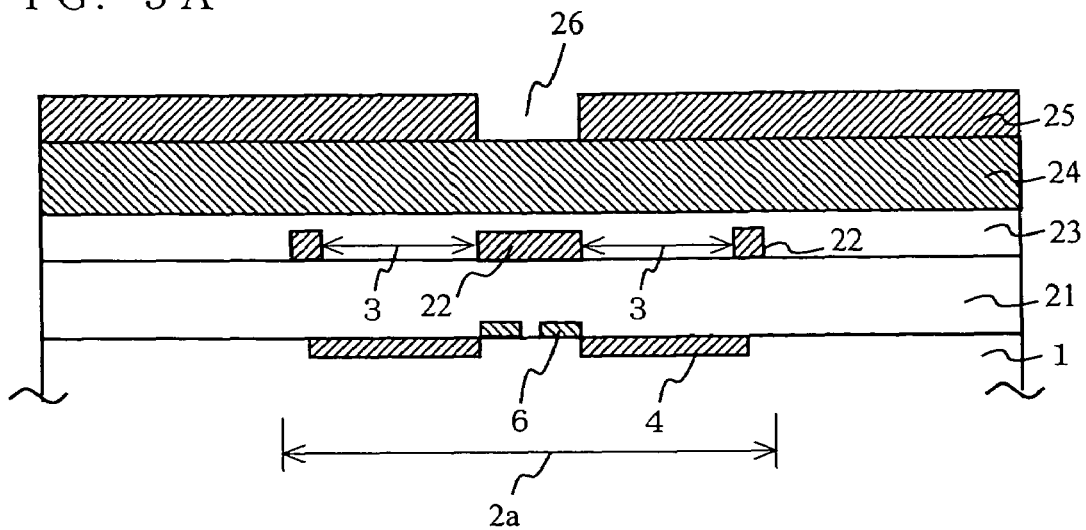
FIGS. 5A to 5C are diagrams showing cross-sectional structures of the solid-state imaging device according to the present invention during fabrication thereof.

Next, a photosensitive resin film 25 is formed by applying a photosensitive resin (a resist) onto the SiN film 24, and is subjected to patterning such that apertures 26 are formed at regular intervals. Within one unit 2a of pixels, an aperture 26 is formed between adjoining light-sensitive areas 3, so that a grid of such apertures 26 is obtained. The widths of the apertures 26 are to be set depending on how much the photosensitive resin (resist) film 25 is transformed when it is subjected to heat treatment as described below. A resulting cross-sectional structure of the solid-state imaging device is shown in FIG. 5A.

Figure 5B:
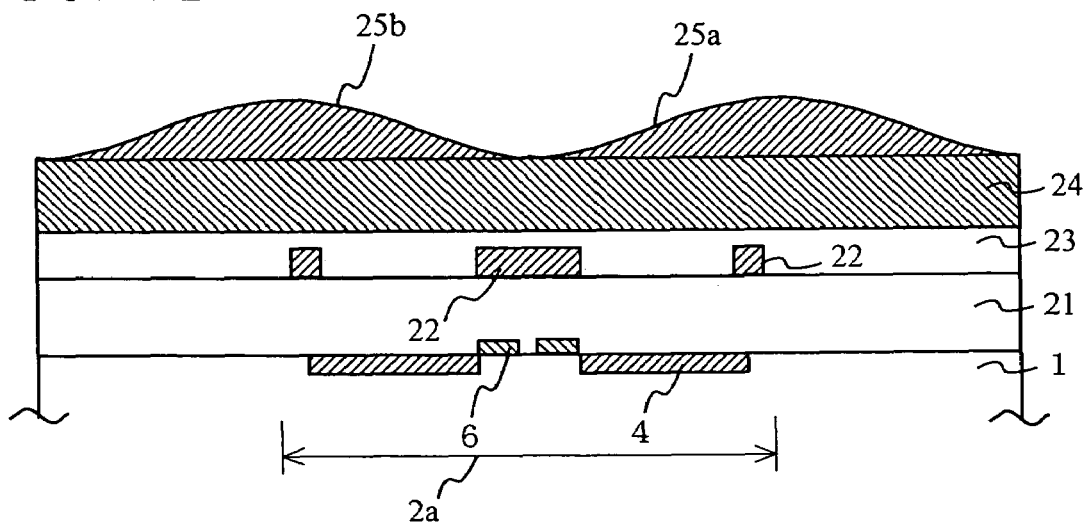

Next, the photosensitive resin film 25 which has been subjected to patterning is melted by heat at a temperature which is close to the melting point of the resin, specifically heat of about 190° C. Thus, in each unit 2a of pixels, prism shapes 25a and 25b that have inclined planes that decrease toward the center of the unit 2a of pixels are formed. A resulting cross-sectional structure of the solid-state imaging device is shown in FIG. 5B.

Figure 5C:
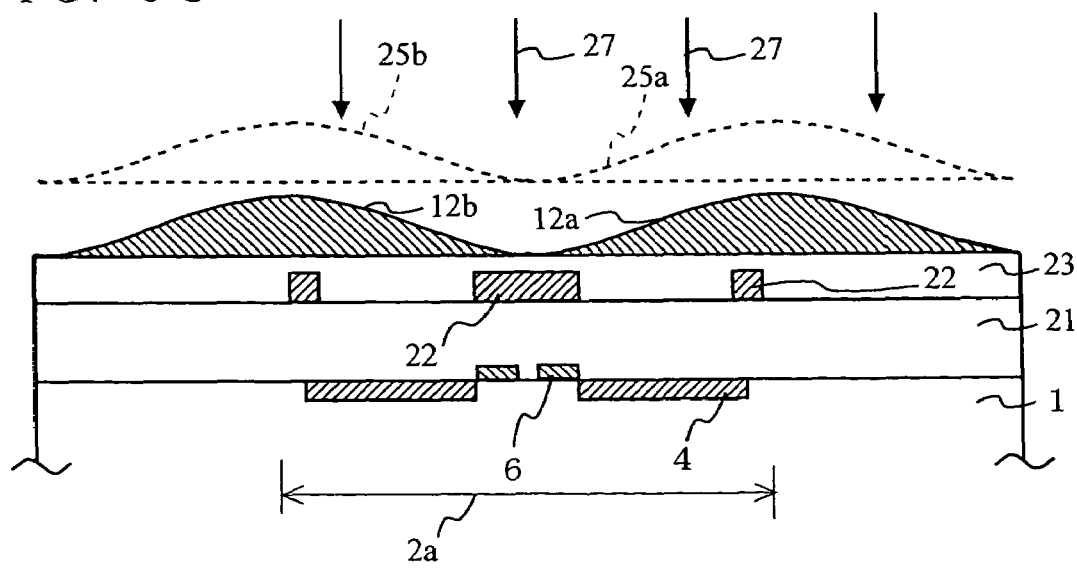

Next, the SiN film 24 is subjected to an etching, using the prism shapes 25a and 25b as masks. Here, as an etching apparatus, a dry etching apparatus is used, with the same etching rate being set for SiN (Silicon Nitride) and the photosensitive resin. Then, light (ultraviolet rays) 27 is emitted on the prism shapes 25a and 25b, whereby the SiN film 24 is subjected to an etching process, so that prisms 12b and 12b that function as light-path change portions are obtained. A resulting cross-sectional structure of the solid-state imaging device is shown in FIG. 5C.

Figure 6A:
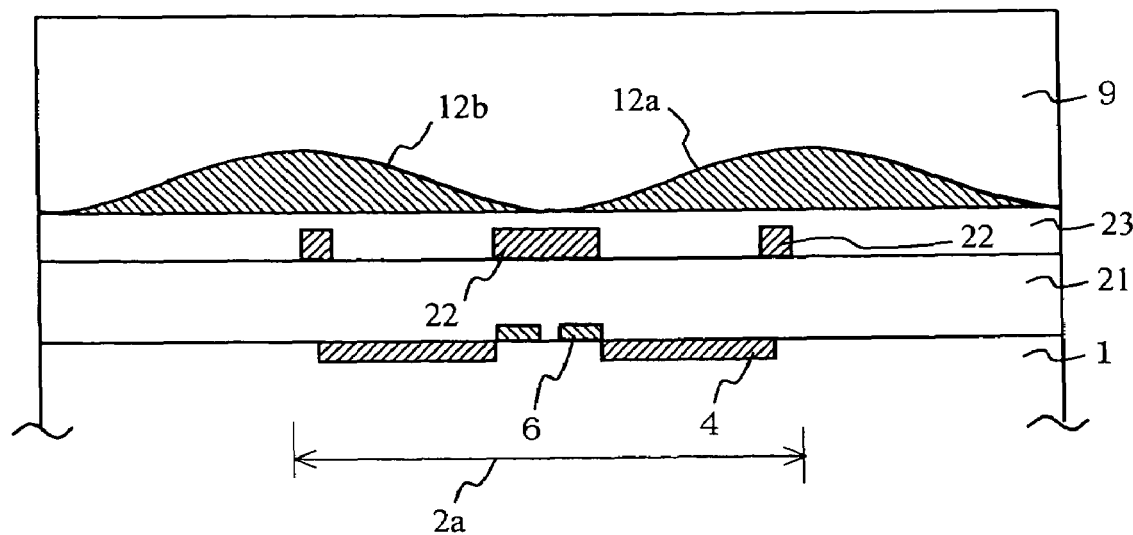
FIG. 6A and FIG. 6B are diagrams showing cross-sectional structures of the solid-state imaging device according to the present invention during fabrication thereof.

Next, a color filter 9 is formed so as to cover the prisms 12a and 12b. Specifically, three or four films are deposited based on color coding by utilizing a staining technique or by the application of a color resist. The color filter 9 has a refractive index lower than that of SiN, which is the material of which the prisms 12a and 12b are formed. A resulting cross-sectional structure of the solid-state imaging device is shown in FIG. 6A.

Figure 6B:
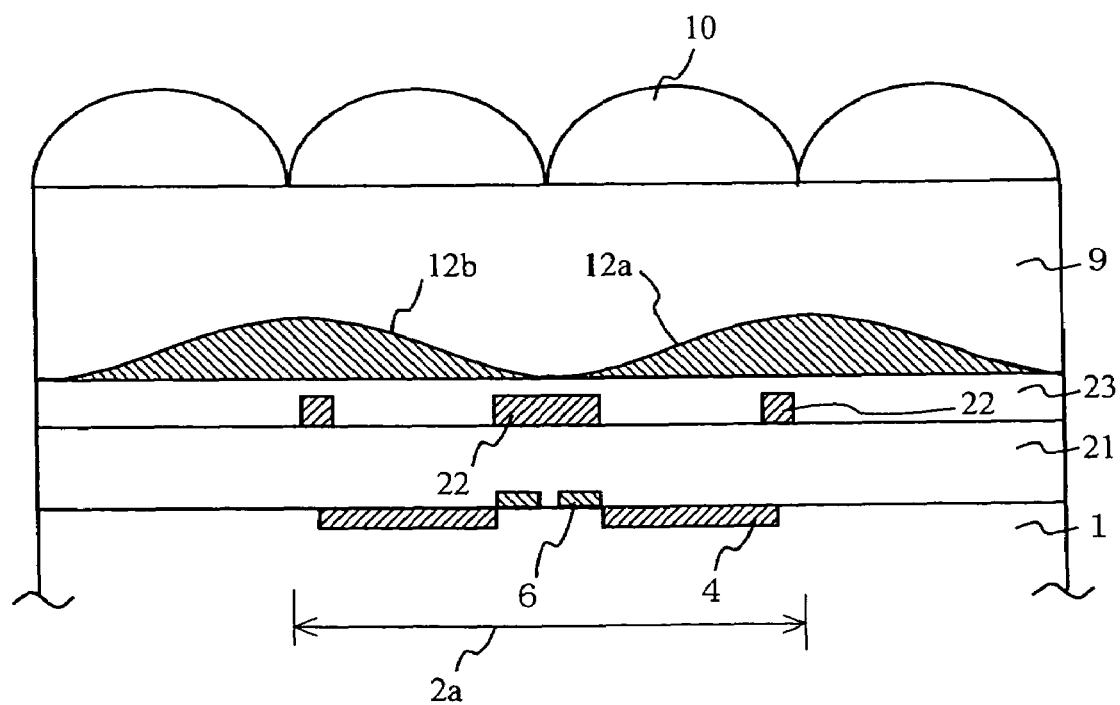

Finally, converging lenses 10 are formed on the color filter 9. Specifically, as converging lenses 10, microlenses that are arranged in an array such that each microlens corresponds to the light-sensitive area 3 of a pixel 2 are formed by a thermal reflow transcription technique using an overlying resist for a hot-melt transparent resin. As a result, a solid-state imaging device that has a structure as shown in FIG. 6B is completed.

As described above, in a solid-state imaging device according to the present embodiment, a high light-condensing rate is achieved without the necessity of altering the arrangement of a converging lens even though the center of a light-sensitive area is offset from the center of the corresponding pixel 2 when seen from directly above a principal surface of a semiconductor substrate. As a result, a solid-state imaging device in which the miniaturization of pixels 2 is realized and which at the same time realizes a high image quality is provided.

Figure 7A:
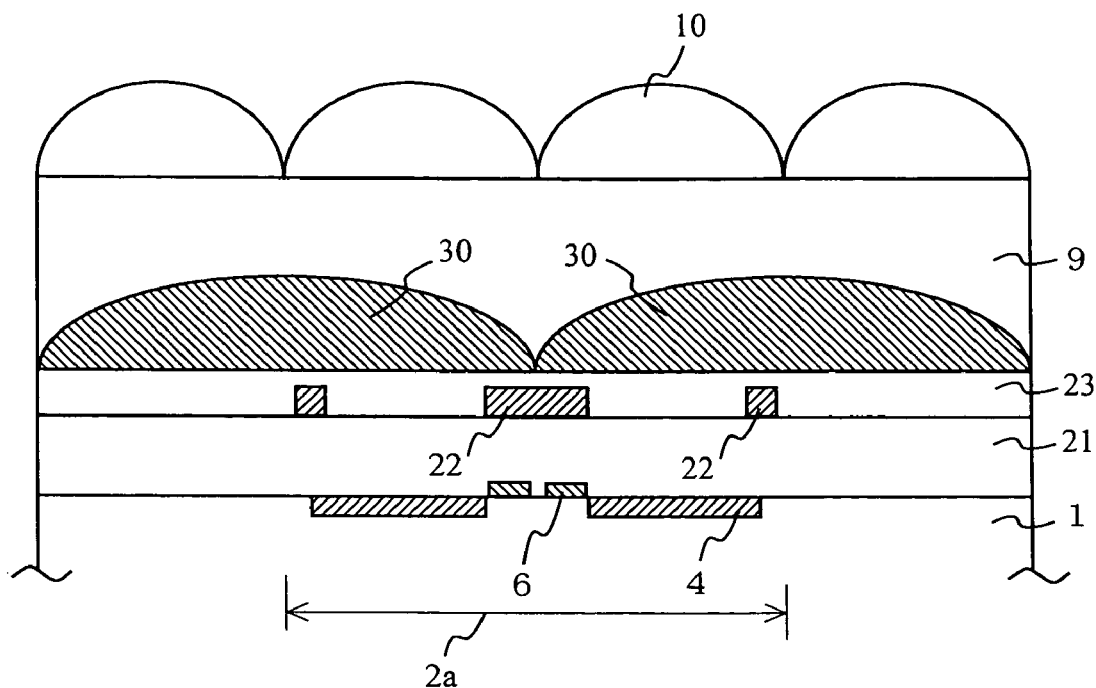
FIG. 7A is a diagram showing another example of a structure of a light-path change portion of the solid-state imaging device according to the present invention.

The present embodiment has illustrated an exemplary case where the prisms 12a and 12b, each of which is provided corresponding to two pixels as one unit, are used. Alternatively, convex lenses 30 each of which is provided corresponding to two pixels as one unit may be used as shown in FIG. 7A, instead of prisms.

Figure 7B:
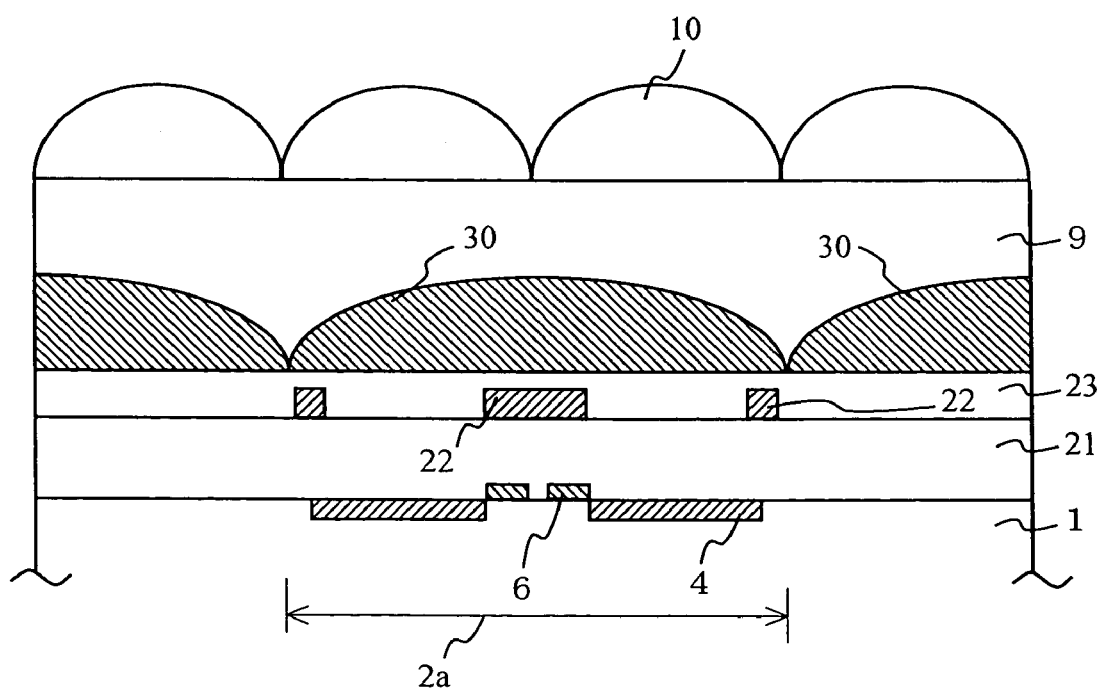
FIG. 7B is a diagram showing another example of a structure of the light-path change portion of the solid-state imaging device according to the present invention.
Figure 7C:
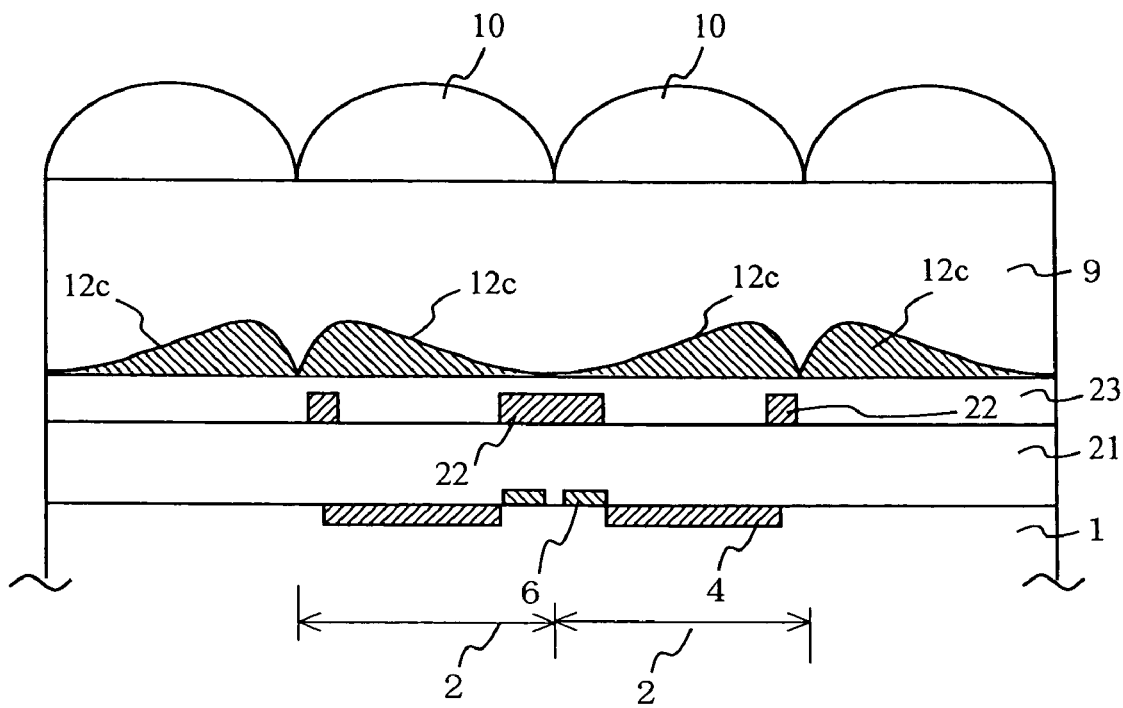
FIG. 7C is a diagram showing another example of a structure of the light-path change portion of the solid-state imaging device according to the present invention.

Besides, the present embodiment has illustrated an exemplary case where: each converging lens 10 is formed so as to correspond to one light-sensitive area 3, that is, to correspond to one pixel 2; light-path change portions are periodically arranged so that each corresponds to a plurality of pixels as one unit; and each light-path change portion is formed astride a plurality of units 2a of pixels. Alternatively, a structure as shown in FIG. 7B may be adopted, where each converging lens 10 is formed so as to correspond to one pixel 2 and each light-path change portion is formed so as to correspond to one unit 2a of pixels. Moreover, as shown in FIG. 7C, the converging lenses 10 and the prisms 12c may be formed so that each corresponds to one pixel 2.

Figure 7D:
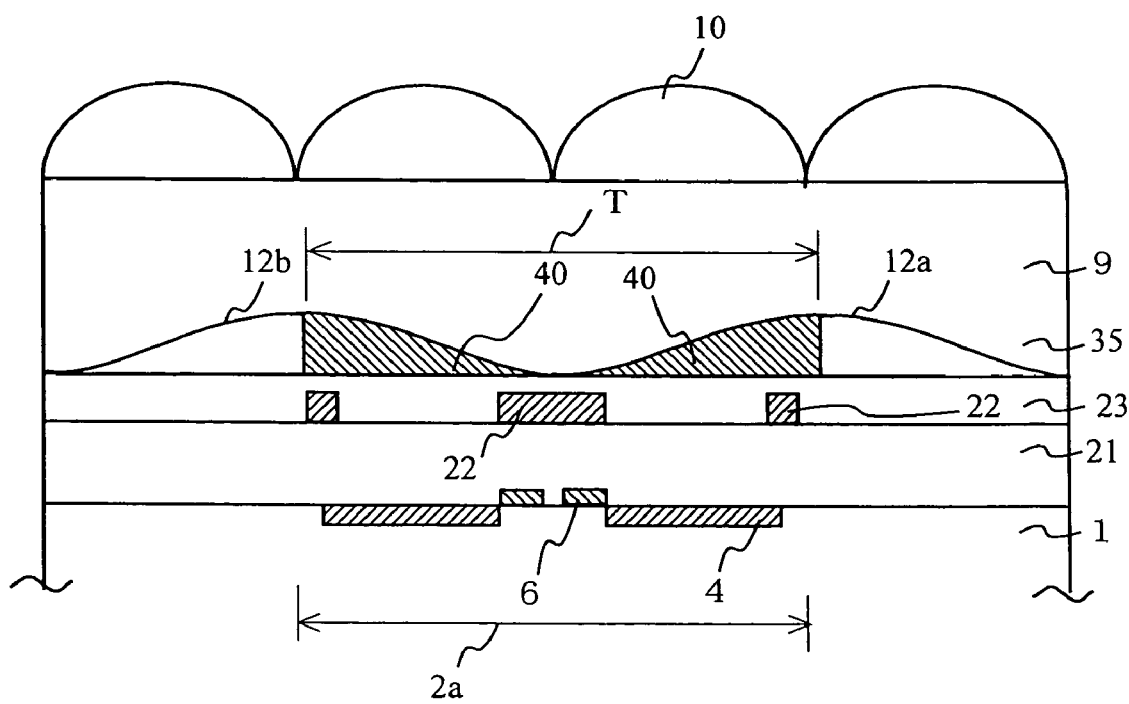
FIG. 7D is a diagram showing another example of a structure of the light-path change portion of the solid-state imaging device according to the present invention.

In the description above, the prisms 12a and 12b are described as "prisms that have convex surfaces on the incident sides." However, depending on the curvatures of the incident surfaces of the prisms, as shown in FIG. 7D, the portions of the prisms indicated by T can together be regarded as constituting a concave lens 40 that has a concave surface on the incident side.

Figure 7E:
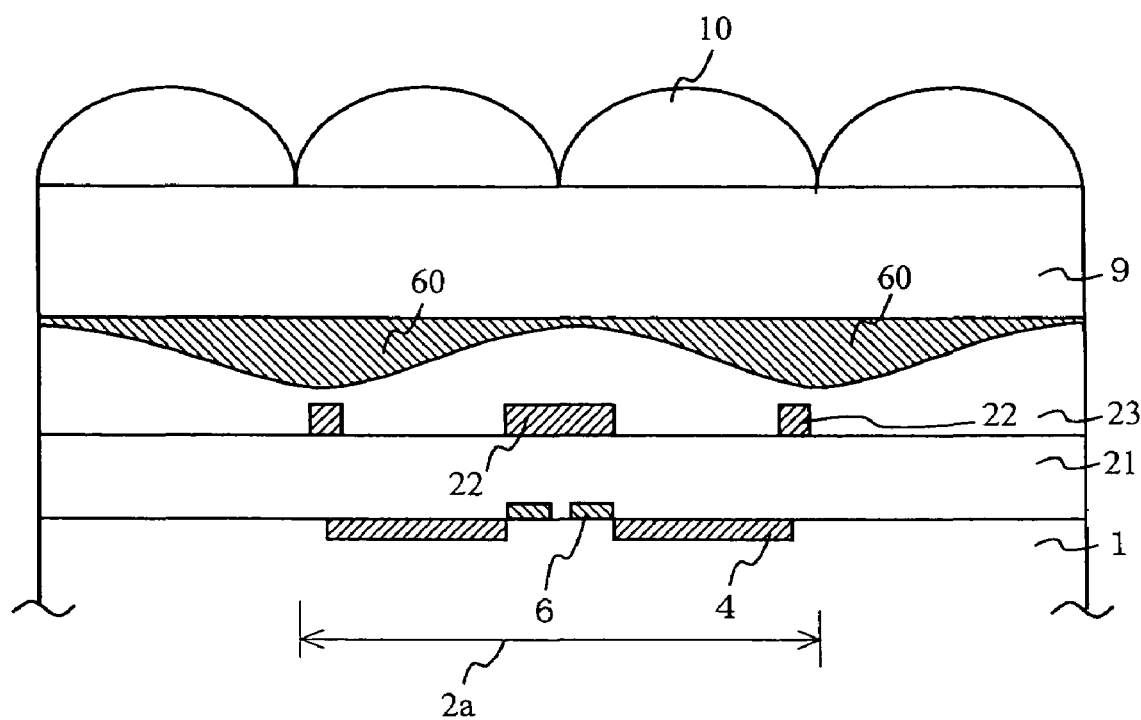
FIG. 7E is a diagram showing another example of a structure of the light-path change portion of the solid-state imaging device according to the present invention.

As described above, a light-path change portion according to the present invention is to be formed in a layer through which incident light passes before impinging on the light-sensitive area and which is formed of a material whose refractive index is higher than those of the materials of which the layer directly above and the layer directly below are formed. In addition, the light-path change portion according to the present invention has a tilt with respect to a light-receiving surface of the light-sensitive area. Therefore, other than the variants shown in the aforedescribed FIGS. 7A to 7D, an alternative light-path change structure as shown in FIG. 7E may be adopted, in which a convex lens 60 that is convex downward is formed on an upwardly concave surface which is formed in an interlayer insulating film 23, the convex lens 60 being formed of an SiN film whose refractive index is higher than that of the interlayer insulating film 23. Note that the material of the light-path change portions is not restricted only to SiN, and the shape of a light-path change portion is not restricted only to a prism shape and a lens shape.

The present embodiment has illustrated examples where a prism 12a or 12b that functions as a light-path change portion is placed between a semiconductor substrate 1 and a converging lens 8 so that the prism 12a or 12b refracts incident light that has been focused by the converging lens 8. However, the positional relationship between the light-path change portion and the converging lens 8 is not restricted to the above, and the light-path change portions may be placed at other locations. For example, a light-path change portion may be placed above a converging lens 8 so that the light-path change portion deflects incident light before it enters the converging lens 8. Furthermore, since a plurality of light-path change portions may be provided for one converging lens 8, light-path change portions may be placed both above and below a converging lens 8.

Moreover, although the present embodiment has illustrated an exemplary solid-state imaging device in which two pixels are constructed as one cell, the construction is not restricted to the above in the present invention. The present invention may also be applied to a solid-state imaging device in which one cell is composed of more than two pixels, e.g., three four, or more pixels.

Figure 8:
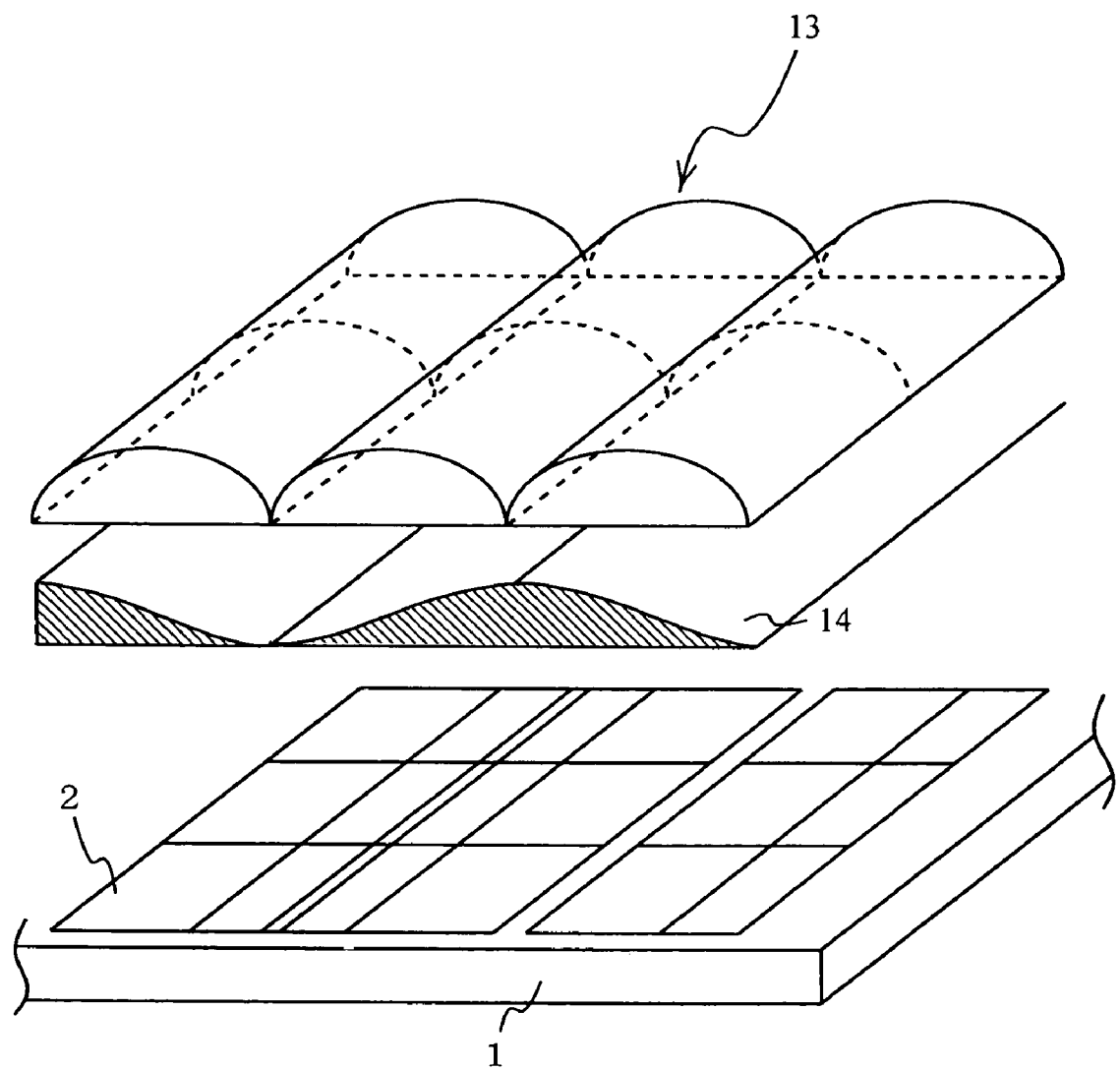
FIG. 8 is a diagram showing another example of a structure of the solid-state imaging device according to the present invention.
Figure 9:
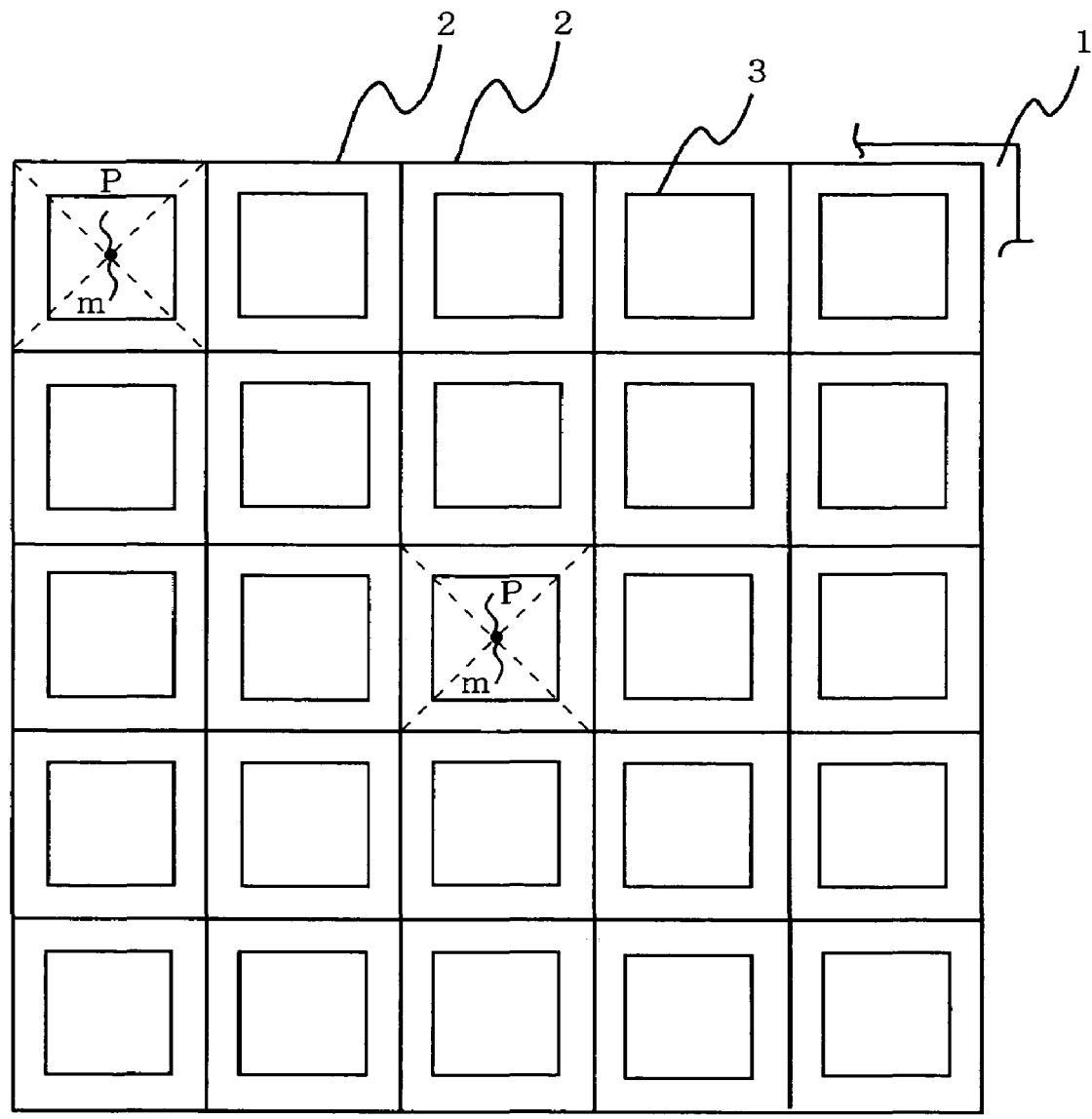
FIG. 9 is a diagram showing a relative arrangement of pixels and light-sensitive areas of a conventional solid-state imaging device in which one pixel defines one cell.
Figure 10:
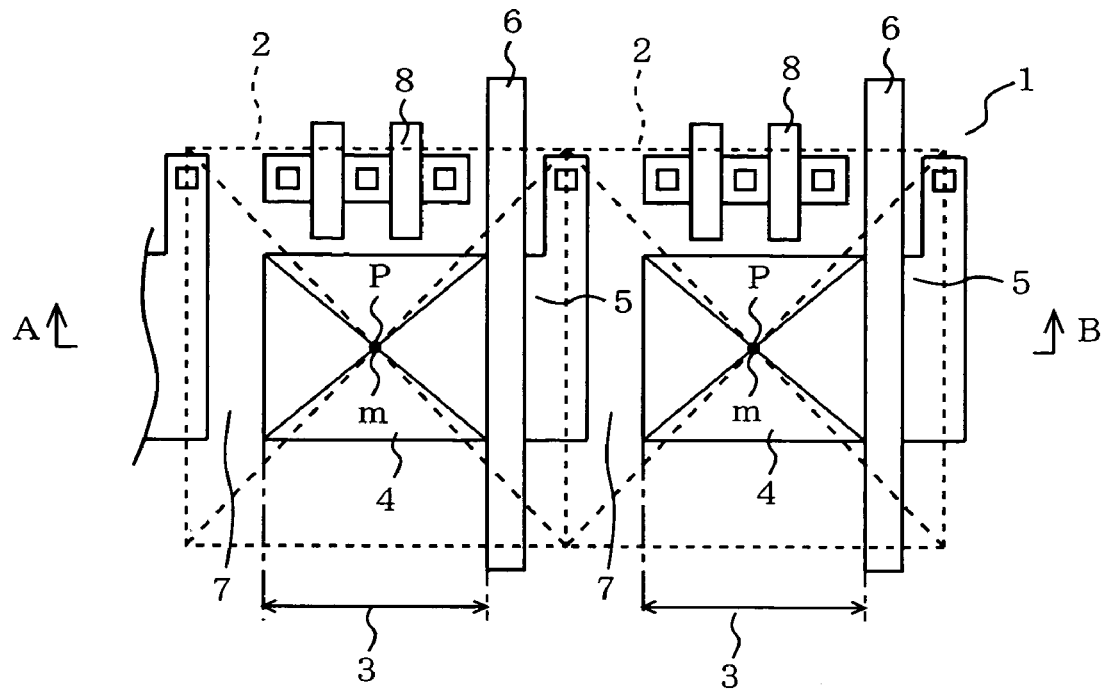
FIG. 10 is a diagram showing a planar structure of the conventional solid-state imaging device in which one pixel defines one cell.
Figure 11:
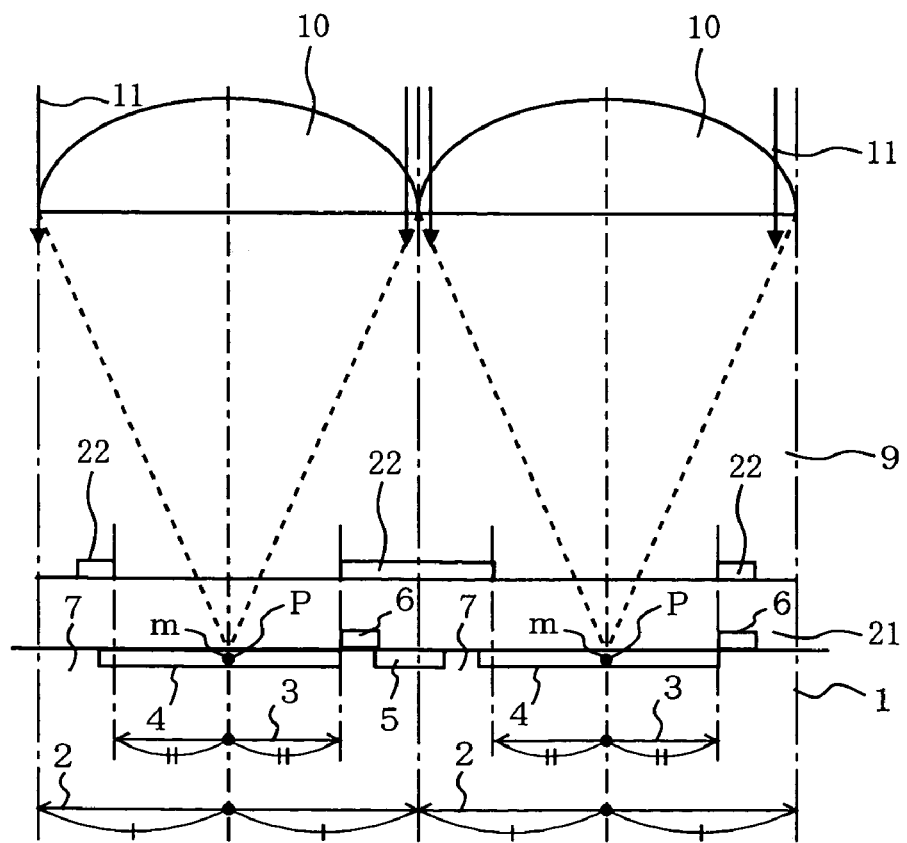
FIG. 11 is a diagram showing a cross-sectional structure of the conventional solid-state imaging device in which one pixel defines one cell.
Figure 12:
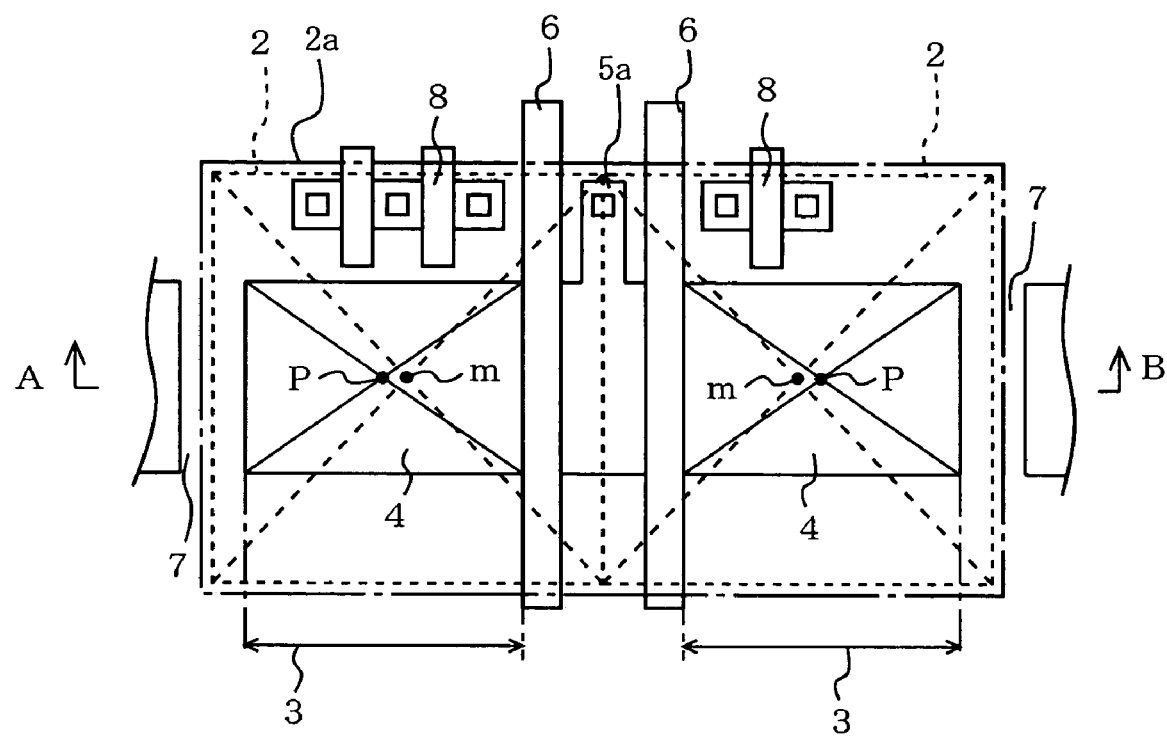
FIG. 12 is a diagram showing a planar structure of a conventional solid-state imaging device in which two pixels define one cell.
Figure 13:
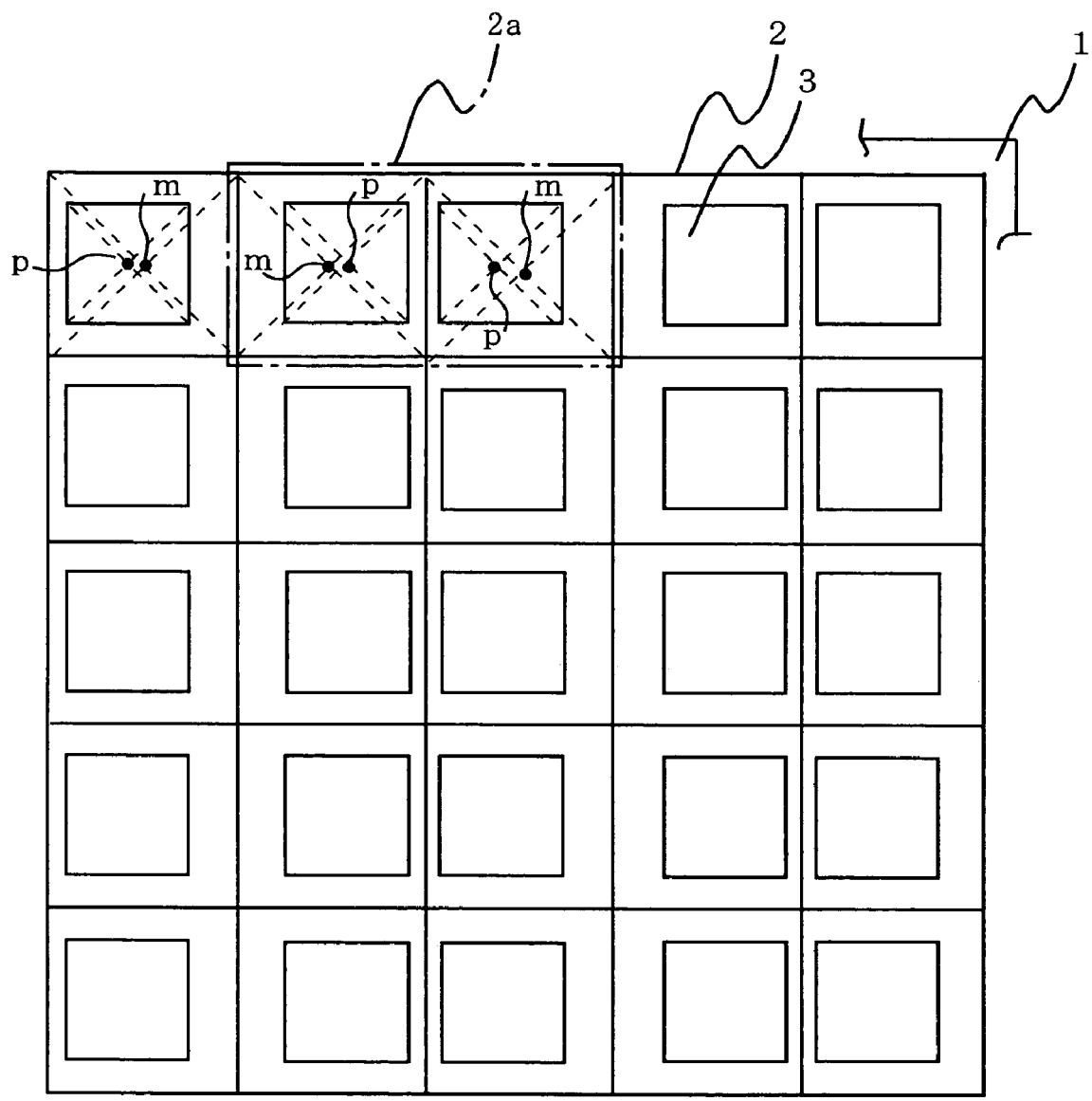
FIG. 13 is a diagram showing a relative arrangement of pixels and light-sensitive areas of the conventional solid-state imaging device in which two pixels define one cell.

Moreover, as converging lenses 10, the present embodiment has illustrated exemplary microlenses each corresponding to one pixel 2, but lenses that are periodically arranged so that each lens corresponds to a unit of (more than one) pixels may be used. Furthermore, as is shown in FIG. 8, lenticular (cylindrical) lenses 13 whose vertical cross section taken along a row direction of a matrix of pixels is identical throughout the matrix may be used. In this case, prismatic arrays 14 whose vertical cross section taken along a row direction of the matrix of the pixels is identical throughout the matrix, similarly to the converging lenses 10, may be used as light-path change portions. Furthermore, instead of prismatic arrays 14, lenticular lenses whose vertical cross section taken along a row direction of the matrix of the pixels is identical throughout the matrix may be used. Although each of the lenticular lenses 13 shown in FIG. 8 has a width corresponding to one pixel when seen in a vertical cross section thereof taken along a row direction of the matrix, each lens may have a width corresponding to a plurality of pixels. Similarly, prismatic arrays 14 or lenticular lenses that function as light-path change portions may have a width corresponding to one pixel or a width corresponding to a plurality of pixels when seen in a vertical cross section thereof taken along a row direction of the matrix of the pixels. Moreover, converging lenses and/or light-path change portions whose vertical cross section taken along a column direction of the matrix of the pixels is identical throughout the matrix may be used.

Moreover, the present embodiment has illustrated an exemplary MOS type solid-state imaging device as a solid-state imaging device, but the solid-state imaging device may be a CCD solid-state imaging device.

A solid-state imaging device according to the present embodiment may be suitably used for a camera, particularly a digital still camera.

A solid-state imaging device according to the present invention may be suitably used for an amplifying solid-state imaging device, particularly an MOS type solid-state imaging device having a trench isolation structure. Specifically, a solid-state imaging device according to the present invention may be suitably used as a solid-state imaging device used in a camera-equipped mobile phone, a video camera, a digital still camera, and the like, and may be used as a line sensor used in a printer and the like.

While the invention has been described in detail, the foregoing description is in all aspects illustrative and not restrictive. It is understood that numerous other modifications and variations can be devised without departing from the scope of the invention.

What is claimed is:

1. A solid-state imaging device comprising a semiconductor substrate and a plurality of pixels arranged on the semiconductor substrate, wherein
   a predetermined number of neighboring pixels share a drain region to form a cell,
   each of the plurality of pixels includes:
      a photoelectric conversion portion provided on the semiconductor substrate;
      a gate electrode provided between the photoelectric conversion portion and the drain region on the semiconductor substrate;
      a light-path change member which is provided above the photoelectric conversion portion and has a curved surface; and
      a converging lens provided above the light-path change member,
   in each of the plurality of pixels, a center of the photoelectric conversion portion is displaced from a center of said each of the plurality of the pixels in a direction parallel to a principal surface of the semiconductor substrate;
   in the cell, displacement directions of centers of photoelectric conversion portions in the predetermined number of pixels are different from each other, and
   in each of the predetermined number of pixels in the cell, the light-path change member deflects an incident light, which has been converged by the converging lens, in accordance with a displacement direction of the center of the photoelectric conversion portion.

2. The solid-state imaging device according to claim 1, wherein,
   the plurality of pixels are arranged in a matrix such that centers of the plurality of photoelectric conversion portions are positioned at regular intervals, and
   centers of the plurality of photoelectric conversion portions are deviated from the regular intervals, so that a center of each of the plurality of photoelectric conversion portions is offset from a center of a corresponding pixel when seen from directly above the principal surface of the semiconductor substrate.

3. The solid-state imaging device according to claim 1, wherein the at least one converging lens is in a periodic arrangement such that one period corresponds to a plurality of pixels.

4. The solid-state imaging device according to claim 1, wherein,
   the plurality of pixels are arranged in a matrix such that centers of the plurality of pixels are positioned at regular intervals, and
   the at least one converging lens is a lenticular lens whose vertical cross section taken along a row direction of the matrix of the plurality of pixels or whose vertical cross section taken along a column direction of the matrix of the plurality of pixels is identical throughout the matrix.

5. The solid-state imaging device according to claim 1, wherein the light-path change member is in a shape of a lens or in a shape of a prism.

6. The solid-state imaging device according to claim 1, wherein the light-path change members are in a periodic arrangement such that one period corresponds to a plurality of pixels.

7. The solid-state imaging device according to claim 6, wherein,
   the plurality of pixels are arranged in a matrix such that centers of the plurality of pixels are positioned at regular intervals, and
   a vertical cross section, taken along a row direction of the matrix of the plurality of pixels or a column direction of the matrix of the plurality of pixels, of the light-path change members is identical throughout the matrix.

8. The solid-state imaging device according to claim 7, wherein the light-path change members are lenticular lenses or prismatic arrays.

9. The solid-state imaging device according to claim 1, wherein the light-path change member has a shape obtained by joining a triangular prism and a convex lens together, with an inclined plane of the triangular prism and a level plane of the convex lens being adhered to each other.

10. The solid-state imaging device according to claim 1, wherein the solid-state imaging device is an amplifying solid-state imaging device.

11. A camera including a solid-state imaging device,
    the solid-state imaging device comprising a semiconductor substrate and a plurality of pixels arranged on the semiconductor substrate, wherein
    a predetermined number of neighboring pixels share a drain region to form a cell,
    each of the plurality of pixels includes:
       a photoelectric conversion portion provided on the semiconductor substrate;
       a gate electrode provided between the photoelectric conversion portion and the drain region on the semiconductor substrate;
       a light-path change member which is provided above the photoelectric conversion portion and has a curved surface; and
       a converging lens provided above the light-path change member,
    in each of the plurality of pixels, a center of the photoelectric conversion portion is displaced from a center of said each of the plurality of the pixels in a direction parallel to a principal surface of the semiconductor substrate,
    in the cell, displacement directions of centers of photoelectric conversion portions in the predetermined number of pixels are different from each other, and
    in each of the predetermined number of pixels in the cell, the light-path change member deflects an incident light, which has been converged by the converging lens, in accordance with a displacement direction of the center of the photoelectric conversion portion.

12. A solid-state imaging device comprising a semiconductor substrate and a plurality of pixels arranged on the semiconductor substrate, wherein
    a predetermined number of neighboring pixels share a drain region to form a cell,
    each of the plurality of pixels includes:
       a photoelectric conversion portion provided on the semiconductor substrate;
       a gate electrode provided between the photoelectric conversion portion and the drain region on the semiconductor substrate;

a light-path change element which is provided above the photoelectric conversion portion and has a curved surface;

a converging lens provided above the light-path change element, in each of the plurality of pixels, a center of the photoelectric conversion portion is displaced from a center of said each of the plurality of the pixels in a direction parallel to a principal surface of the semiconductor substrate, in the cell, displacement directions of centers of photoelectric conversion portions in the predetermined number of pixels are different from each other, and in each of the predetermined number of pixels in the cell, the light-path change element deflects an incident light, which has been converged by the converging lens, in accordance with a displacement direction of the center of the photoelectric conversion portion, the plurality of pixels each satisfy one of a predetermined number of positional relationships between the center of the pixel and the center of the photoelectric conversion portion when seen from directly above a principal surface of the semiconductor substrate, such that the predetermined number of neighboring pixels satisfying all of the predetermined number of positional relationships constitute one unit of pixels which is the cell, the cell thus has a structure containing the predetermined number of neighboring pixels which is identical with that of each of other cells, and light-path change elements in the cell form one unit of light-path change member.

13. A solid-state imaging device comprising a semiconductor substrate and a plurality of pixels arranged on the semiconductor substrate, wherein a predetermined number of neighboring pixels share a drain region to form a cell, each of the plurality of pixels includes:
a photoelectric conversion portion provided on the semiconductor substrate;
a gate electrode provided between the photoelectric conversion portion and the drain region on the semiconductor substrate;
a light-path change element which is provided above the photoelectric conversion portion and has a curved surface; and
a converging lens provided above the light-path change element, in each of the plurality of pixels, a center of the photoelectric conversion portion is displaced from a center of said each of the plurality of the pixels in a direction parallel to a principal surface of the semiconductor substrate, in the cell, displacement directions of centers of photoelectric conversion portions in the predetermined number of pixels are different from each other, and in each of the predetermined number of pixels in the cell, the light-path change element deflects an incident light, which has been converged by the converging lens, in accordance with a displacement direction of the center of the photoelectric conversion portion, the plurality of pixels each satisfy one of a predetermined number of positional relationships between the center of the pixel and the center of the photoelectric conversion portion when seen from directly above a principal surface of the semiconductor substrate, such that the predetermined number of neighboring pixels satisfying all of the predetermined number of positional relationships constitute one unit of pixels, the cell thus has a structure containing the predetermined number of neighboring pixels which is identical with that of each of other cells, and light-path change elements in a predetermined number of neighboring cells form one unit of light-path change member.

* * * * *